(12) United States Patent
Devarajan et al.

(10) Patent No.: US 9,641,166 B2
(45) Date of Patent: May 2, 2017

(54) BOOTSTRAPPED SWITCHING CIRCUIT WITH FAST TURN-ON

(71) Applicant: ANALOG DEVICES, INC., Norwood, MA (US)

(72) Inventors: Siddharth Devarajan, Arlington, MA (US); Lawrence A. Singer, Wenham, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 321 days.

(21) Appl. No.: 14/206,006

(22) Filed: Mar. 12, 2014

(65) Prior Publication Data

US 2014/0266392 A1    Sep. 18, 2014

Related U.S. Application Data

(60) Provisional application No. 61/784,773, filed on Mar. 14, 2013.

(51) Int. Cl.
| | |
|---|---|
| *H03K 17/04* | (2006.01) |
| *H03K 17/16* | (2006.01) |
| *G11C 27/02* | (2006.01) |
| *H03K 17/0412* | (2006.01) |

(52) U.S. Cl.
CPC ............. *H03K 17/04* (2013.01); *G11C 27/02* (2013.01); *H03K 17/04123* (2013.01); *H03K 2217/0054* (2013.01)

(58) Field of Classification Search
CPC .............................. H03K 17/04; H03M 1/1245
USPC ...... 327/376, 390, 108–112, 94, 95; 326/82, 326/83, 87; 341/122–125
See application file for complete search history.

(56) References Cited

U.S. PATENT DOCUMENTS

| | | | |
|---|---|---|---|
| 6,060,937 A  * | 5/2000 | Singer | ............. H03K 19/01735 327/390 |
| 6,160,508 A | 12/2000 | Gustavsson et al. | |
| 8,030,974 B1 | 10/2011 | Oo | |

(Continued)

FOREIGN PATENT DOCUMENTS

WO        2012/170634        12/2012

OTHER PUBLICATIONS

Extended European Patent Office Search Report and Written Opinion for EP14159383.0 mailed Jun. 26, 2014, 7 pages.

(Continued)

*Primary Examiner* — Lincoln Donovan
*Assistant Examiner* — Thomas Skibinski
(74) *Attorney, Agent, or Firm* — Patent Capital Group

(57) ABSTRACT

An apparatus and method for implementing a bootstrapped switching circuit having improved (i.e. faster) turn-on time is provided. In an embodiment, an inner switching loop is implemented in a bootstrapped switching circuit where the inner switching loop is configured to turn on an input switch in the bootstrapped drive circuit independent of the drive circuit output. The embodiment decouples the inner switching loop circuitry from the output drive circuit of the bootstrapped switching circuit, which typically has a larger load capacitance than the inner switching loop. This allows the inner switching loop to turn on the input switch in the bootstrapped switching circuit faster and decreases the turn-on time of the bootstrapped switching circuit.

20 Claims, 8 Drawing Sheets

(56) References Cited

U.S. PATENT DOCUMENTS

2009/0009219 A1    1/2009   Mathur et al.
2013/0009797 A1*   1/2013   Grilo .................... H03K 17/063
                                                                           341/122

OTHER PUBLICATIONS

Response to Extended European Patent Office Search Report and Written Opinion for EP14159383.0 filed Mar. 12, 2015, 16 pages.

* cited by examiner

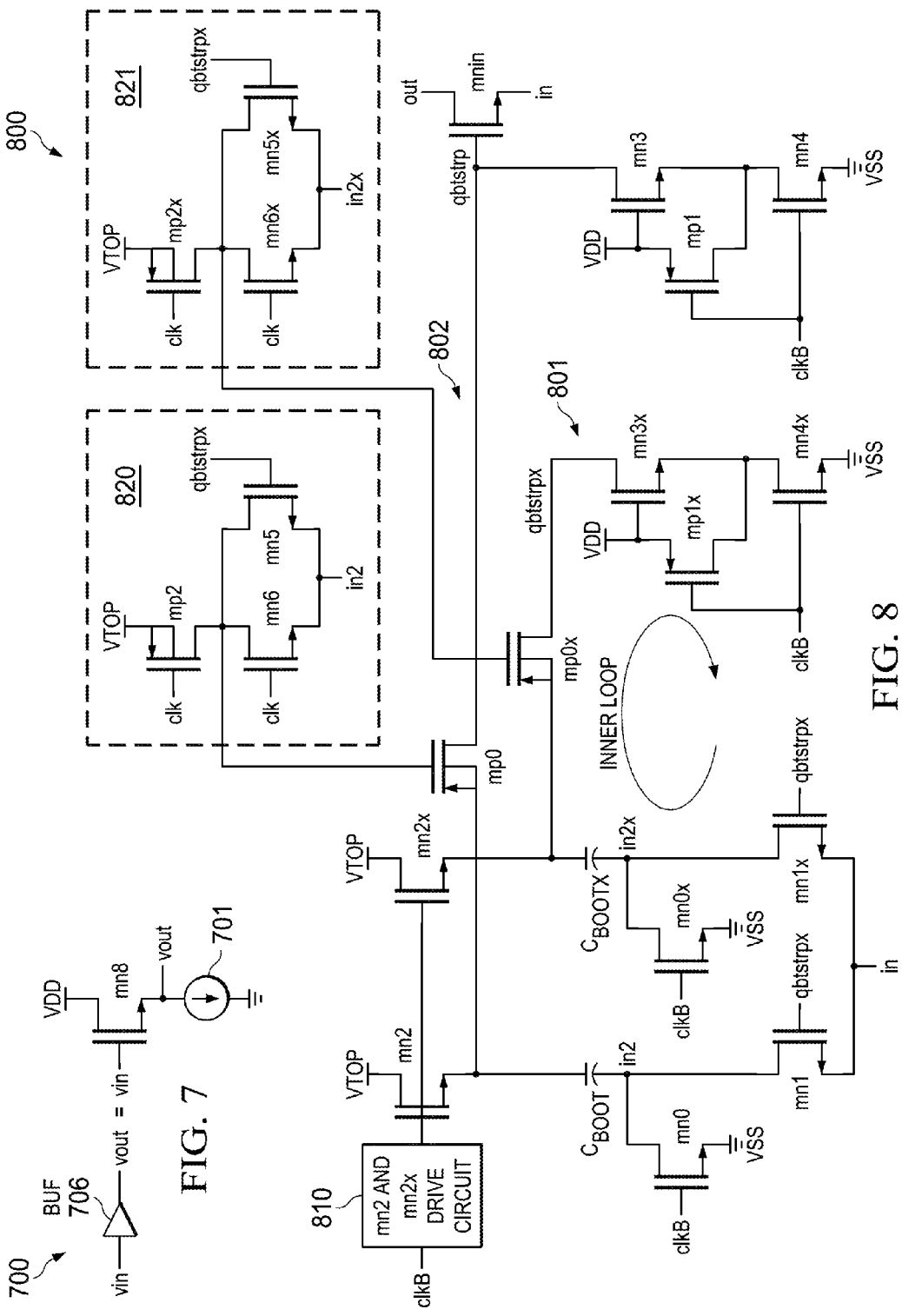

BOOTSTRAPPED SWITCHING CIRCUIT WITH FAST TURN-ON

PRIORITY DATA

This application claims the priority of Provisional Patent Application Ser. No. 61/784,773, filed Mar. 14, 2013, which is hereby incorporated by reference in its entirety.

TECHNICAL FIELD OF THE DISCLOSURE

This present disclosure relates generally to switching circuits, and more particularly, to an apparatus, method and system for implementing a bootstrapped switching circuit having fast turn-on time.

BACKGROUND

Bootstrapped switches are widely used in various types of circuit applications. In one example, a bootstrapped drive circuit may be used to provide an output voltage generated from a charged capacitor (which will be referred to as a "boot" capacitor—$C_{BOOT}$) to drive the gate of a MOSFET switch and turn on the MOSFET switch, which will be referred to as a bootstrapped switch. The bootstrapped drive circuit is clocked by a clock signal that switches the bootstrapped switch between an off state in which the output voltage is low and the boot capacitor is charged, and an on state in which the output voltage is high to turn on the bootstrapped MOSFET switch. This technique may be used, for example, to connect an input signal received on the source terminal of the MOSFET switch to an output load connected to the drain terminal of the MOSFET switch.

A bootstrapped drive circuit may be typically configured to provide the output voltage when in the on state at a high enough voltage level to ensure that the MOSFET switch remains on and with a voltage offset based on the input signal. The output voltage is provided at a voltage that is equal to the voltage stored across the boot capacitor plus the voltage level of the input signal. In the example above the voltage seen at the gate of the MOSFET would then be equal to the voltage stored across the capacitor plus the voltage level of the input signal and would track the input signal when the bootstrapped switch was on. This maintains a relatively constant gate to source voltage for the MOSFET switch across all input signal levels, which provides significant linearity improvement when using such a bootstrapped switch in, for example, a sampling circuit like a voltage sample and hold, compared to using a MOSFET switch with its gate voltage driven high to a fixed voltage. These aspects of a bootstrapped switching circuit, which includes the bootstrapped drive circuit and the bootstrapped switch itself, provide advantages that may be utilized in many other switching circuit applications. Because bootstrapped switches are widely used in the above described example application and in many other varied switching circuit applications, it would provide an advantage, therefore, to have an improved bootstrapped switching circuit having improved performance with faster turn-on time.

Overview

In one example embodiment the method, apparatus and system comprises a switching circuit that has an input for receiving an input signal and includes a bootstrapped drive circuit having an input switch coupled to the input and including a first output. The bootstrapped drive circuit is configured to receive the input signal at the input switch and provide a first drive signal on the first output responsive to the input switch being switched on by a second drive signal. The switching circuit includes a switching loop coupled to the input of the switching circuit. The switching loop has a second output coupled to the input switch of the bootstrapped drive circuit. The switching loop is configured to provide the second drive signal on the second output to the input switch in the bootstrapped drive circuit to turn on the input switch. The embodiment may further comprise a bootstrapped switch coupled to the first output, where the switch is configured to turn on in response to the first drive signal generated by the bootstrapped drive circuit. The switch may receive the input signal at an input and pass it to an output when turned on.

In another embodiment a switching circuit has an input for receiving an input signal and includes a bootstrapped drive circuit having an input switch coupled to the input and including a first output. The bootstrapped drive circuit is configured to receive the input signal at a first input switch and provide a first drive signal on the first output in response to the first input switch being switched on by a second drive signal. The switching circuit includes a switching loop coupled to the input of the switching circuit. The switching loop has a second output coupled to the first input switch in the bootstrapped drive circuit. In this embodiment, the switching loop may further comprise a second input switch coupled to the input of the switching circuit, and the switching loop may be configured to provide the second drive signal to the first input switch in the bootstrapped drive circuit responsive to the second input switch in the switching loop being switched on by the second drive signal. In an alternative embodiment, the first input switch of the bootstrapped drive circuit may be coupled to the first output through a first boot capacitor and the second input switch in the switching loop may be coupled to the second output through a second boot capacitor, providing a boot capacitor for each of the bootstrapped drive circuit and the switching loop. In another alternative, the bootstrapped drive circuit may further comprise a first output switch, wherein the first boot capacitor is coupled to the first output through the first output switch and the switching loop may further comprise a second output switch, wherein the second boot capacitor is coupled to the second output through the second output switch. The first and second output switches may switch on in response to at least one clock signal, for example, a clock signal input to both switches, and provide the first and second drive signals.

In another embodiment a switching circuit has an input for receiving an input signal and includes a bootstrapped drive circuit having an input switch coupled to the input and including a first output. The bootstrapped drive circuit is configured to receive the input signal at the input switch and provide a first drive signal on the first output responsive to the input switch being switched on by a second drive signal. The switching circuit includes a switching loop coupled to the input of the switching circuit. The switching loop has a second output coupled to the input switch of the bootstrapped drive circuit. In this embodiment, the input switch of the bootstrapped circuit may comprise a shared input switch that functions as an input switch of both the bootstrapped drive circuit and the switching loop. The shared input switch may be coupled to the first output and second output through a boot capacitor and the boot capacitor may function as a boot capacitor for both the bootstrapped drive circuit and the switching loop. In an alternative of this embodiment the bootstrapped drive circuit further comprises a first output switch and the boot capacitor is coupled to the first output through the first output switch. The switching loop may comprise a second output switch and the boot capacitor may be coupled to the second output through the second output switch. The first and second output switches may switch on in response to at least one clock signal, for example, a clock signal input to both switches, and provide the first and second drive signals.

In still another embodiment the switching circuit comprises a buffer coupled between the input of the switching circuit and the input of the switching loop. In an alternative of this embodiment, the buffer may be coupled between the input of the switching circuit and both of the input of the bootstrapped drive circuit and the input of switching loop.

In a further embodiment a pass gate may be coupled between the input of the switching loop and the second output, and turn on in response to at least one clock signal. In this embodiment the switching loop provides the second drive signal to the input switch of the bootstrapped drive circuit when the pass gate is turned on. In alternatives of this embodiment, the pass gate may be implemented in place of the input switch of the switching loop or implemented in parallel with the input switch of the switching loop.

BRIEF DESCRIPTION OF THE DRAWINGS

FIG. 7 illustrates an example buffer that may be incorporated into an example embodiment of the disclosure; and, FIG. 8 illustrates an example bootstrapped switching circuit in accordance with a further embodiment of the disclosure.

DETAILED DESCRIPTION OF EXAMPLE EMBODIMENTS

This present disclosure relates generally to an apparatus, a system, circuitry, and a method for a bootstrapped switching circuit that provides fast turn-on time. In an example embodiment, the switching circuit comprises circuitry implementing a bootstrapped drive circuit and an inner switching loop. In the embodiment, an output signal output from the inner switching loop may be used to turn on an input switch of the bootstrapped drive circuit. The inner switching loop may be utilized to turn on the input switch of the bootstrapped drive circuitry independently from a bootstrapped switch gate that is driven by the bootstrapped drive circuit output. Use of the inner switching loop decouples the bootstrapped drive circuit output from the input switch of the bootstrapped drive circuitry. The devices comprising the inner switching loop circuitry may be chosen to be of a size smaller than the devices in the bootstrapped drive circuitry, allowing the inner switching loop to have much smaller capacitance. Further, the inner switching loop may be configured to not have as large a load capacitance as the bootstrapped drive circuit output capacitance, since the inner switching loop does not have to drive the bootstrapped switch gate, and rather only has to drive the input switch of the bootstrapped drive circuitry, which is typically smaller than the bootstrapped switch gate in size and capacitance. This allows the input switch to turn on much faster than if it were turned on by the output of the bootstrapped drive circuitry that generates the switching circuit output. At least one device comprising the input switch on the inner switching loop of the bootstrapped switch may be a low threshold device, enabling faster turn-on of the input switch of the bootstrapped circuitry. In another embodiment, bootstrapped switching circuitry comprises a buffer that buffers the input signal to the bootstrapped switching circuitry. In an alternative of this embodiment, the buffer may be implemented to only buffer the input signal to the inner switching loop. In yet another alternate embodiment, potentially faster regular oxide threshold (Vth) PMOS transistors may be used with appropriate gate drive circuitry instead of high voltage PMOS transistors. In an alternate embodiment, multiple inner loops may be implemented. The term bootstrapped drive circuit or outer loop is used to mean any circuitry that provides a bootstrapped drive signal to drive an output switch or other load. The term switching loop or inner switching loop is used to mean any circuitry that provides a drive signal to turn on a bootstrapped drive circuit according to the disclosure.

Figure 1A:
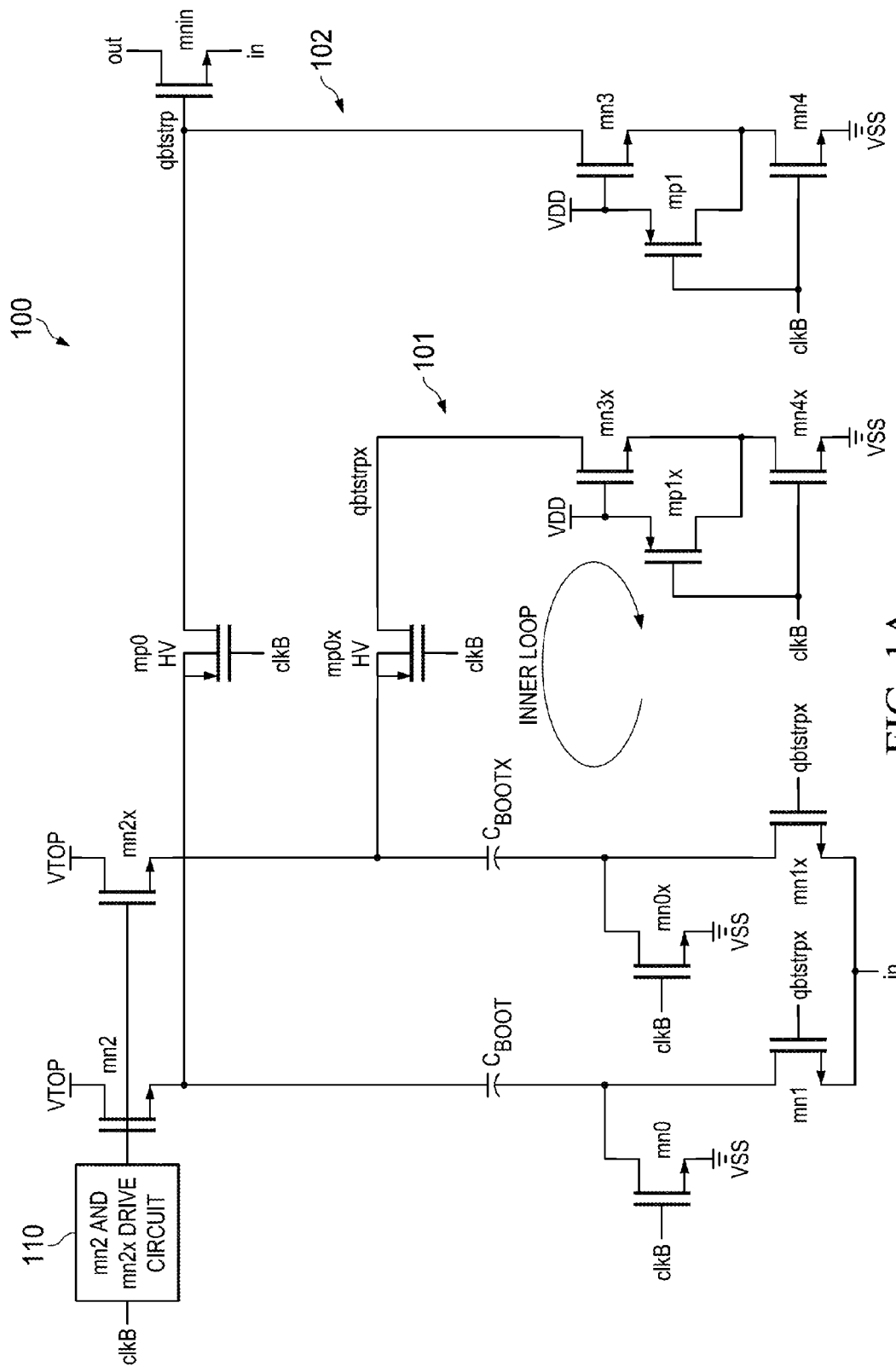
FIG. 1A illustrates an example bootstrapped switching circuit according to an embodiment of the disclosure.

Referring now to FIG. 1A, therein is shown an exemplary bootstrapped switching circuitry 100 in accordance with an embodiment of the disclosure. Bootstrapped switching circuitry 100 comprises bootstrapped drive circuit 102 and inner switching loop 101. Bootstrapped switching circuitry 100 provides faster turn-on by utilizing inner switching loop 101 to turn on the input switch mn1 independent of the output qbtstrp of bootstrapped drive circuit 102. Bootstrapped drive circuit 102 comprises input switch mn1, boot capacitor $C_{BOOT}$, output switch mp0, and switches mn0, mn3, mn4, mp1 and mn2. Inner switching loop 101 comprises input switch mn1x, boot capacitor $C_{BOOTX}$, output switch mp0x, and switches mn0x, mn3x, mn4x, mp1x, and mn2x. Bootstrapped switching circuitry 100 may also include drive circuit 110 and output switch mnin. The embodiment of bootstrapped switching circuitry 100 may be used in any type of switching application. For example, in one possible application bootstrapped switching circuitry 100 may be utilized to turn on switch mnin to allow a signal received at the input terminal labelled "in" on mnin to charge a sampling capacitor coupled to the terminal labelled "out" for sampling in an analog to digital converter. While the embodiment shown in FIG. 1A, and other example embodiments of this disclosure, are shown having example switches implemented as particular MOSFET transistors, a practitioner skilled in the art will realize that the functions and advantages of the disclosure may be realized using various substitutions and alternatives for the technologies and components shown. All such substitutions and alternatives are intended to be covered by this disclosure.

The embodiment of FIG. 1A improves upon prior art bootstrapped switching circuitry with the implementation of an inner switching loop, implemented as example inner switching loop 101, to reduce turn-on time. In prior art implementations, the input switch mn1 of the bootstrapped drive circuit would be turned on by the signal qbtstrp that is output by the bootstrapped drive circuit itself, and the bootstrapped switching circuit would not include any inner switching loop.

In operation of bootstrapped switching circuitry 100, a clkB clock signal is input to drive circuit 110, and to the switching inputs of mn0, mn0x, mp0, mp0x, mp1, mp1x, mn4, and mn4x. When clkB is at logic level high, the qbtstrp output of bootstrapped drive circuit 102 is set low through setting switches mp1, mn3 and mn4 and disconnected from $C_{BOOT}$ by mp0 being in the off state. This causes output switch mnin to be in the off state. Similarly, also when clkB is at logic level high, the qbtstrpx output of switching loop 101 is set low through setting switches mp1x, mn3x and mn4x and disconnected from $C_{BOOTX}$ by mp0x being in the off state. This causes input switches mn1 and mn1x of bootstrapped drive circuit 102 and switching loop 101, respectively, to be turned off. Also, when clkB is high, $C_{BOOT}$ is charged to a voltage VBOOT=VTOP minus VSS (ground) through charging switches mn2 and mn0 and $C_{BOOTX}$ is charged to the voltage VBOOT=VTOP minus VSS (ground) through charging switches mn2x and mn0x.

When clkB changes to logic level low, the qbtstrpx output of switching circuit 101 is set to the voltage VBOOT by the connection of $C_{BOOT}$ to qbtstrpx. This is caused by mp0x turning on and by mn3x and mn4x turning off. When clkB goes low mn0x and mn2x also turn off. Similarly, when clkB changes to logic level low, the qbtstrp output of bootstrapped drive circuit 102 is set to the voltage VBOOT by the connection of $C_{BOOT}$ to qbtstrp. This is caused by mp0 turning on and by mn3 and mn4 turning off. When clkB goes low mn0 and mn2 also turn off. The input switch mn1 of bootstrapped drive circuit 102 and the input switch mn1x of switching circuit 101 are turned on by the drive signal qbtstrpx being set to the voltage VBOOT. A drive signal, such as qbtstrpx, is used according to the disclosure to turn on the input switch mn1 of the bootstrapped drive circuitry that generates the output drive signal qbtstrp. When input switch mn1 turns on the bootstrapped drive circuit output qbtstrp is set to a level of the voltage VBOOT across $C_{BOOT}$ plus the level of the input signal in. The output qbtstrp may then function as an output drive signal. For example, in the embodiment of FIG. 1A qbtstrp may be utilized as an output drive signal to drive an output switch such as, for example, output switch mnin and switch it to the on state. An output drive signal according to the disclosure may be utilized for any other appropriate switching applications.

Figure 2:
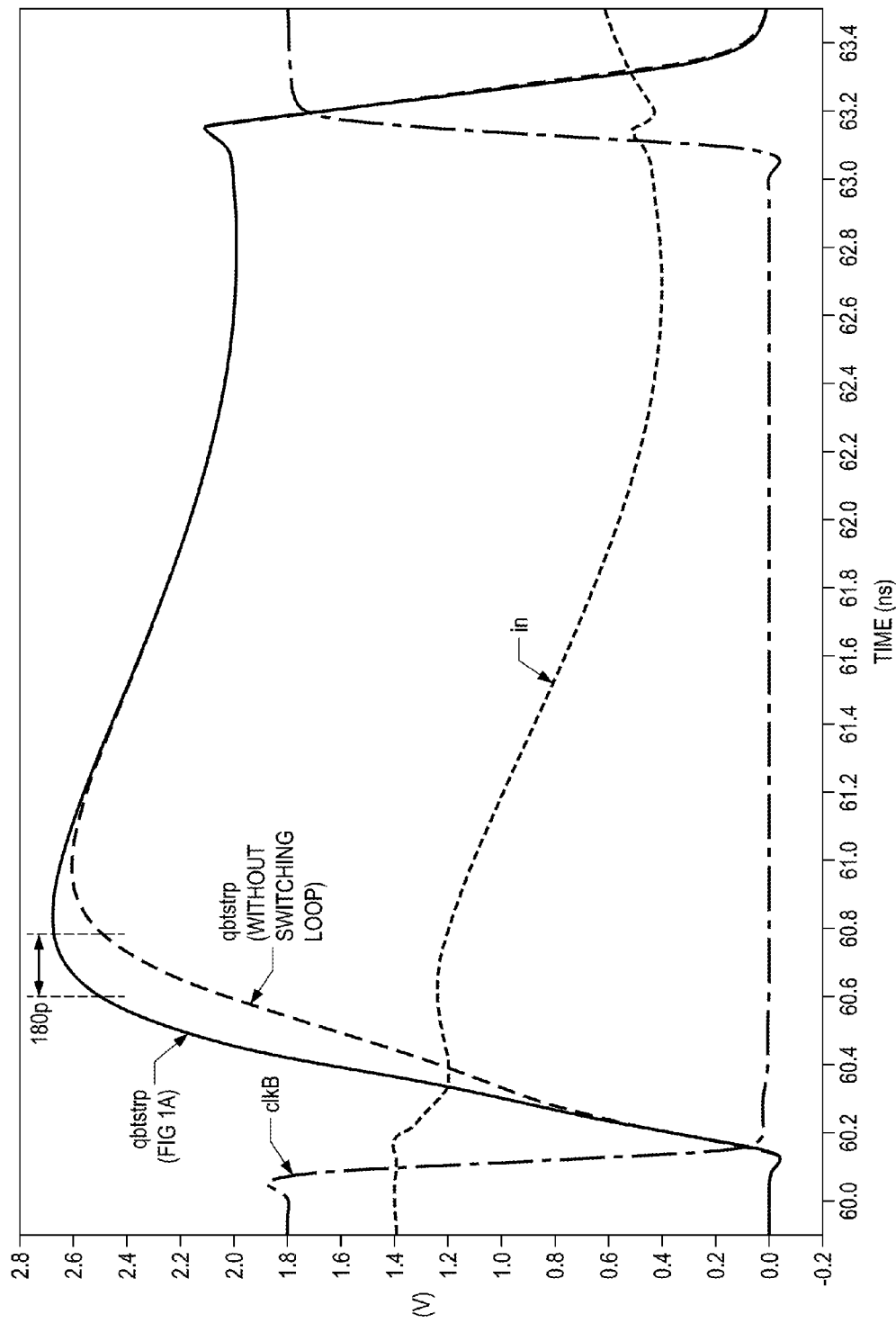
FIG. 2 illustrates an example of waveforms showing turn-on speed improvement according to the embodiment of FIG. 1A.

Referring now to FIG. 2, therein are illustrated simulation results showing the improved turn-on characteristics of the bootstrapped switching circuitry 100 of the embodiment of FIG. 1A. FIG. 2 illustrates plots of the voltage levels of the output qbtstrp (in the embodiment of FIG. 1A), the voltage level of a qbtstrp signal in a switching circuit without an inner switching loop, input clkB, and the input signal "in", on the y-axis, versus time in nanoseconds, on the x-axis. It can be seen that the time difference for turn-on, Tdif, for the particular embodiment of FIG. 1A as compared to not using an inner switching loop is around 180 psec at a qbtstrp voltage level of approximately 2.4 volts. Of course this may vary depending on chosen design parameters and the particular embodiment implemented.

Use of inner switching loop 101 in the example embodiment of FIG. 1A provides faster turn-on by decoupling the inner switching loop 101 (which typically has a small capacitive load), comprised of mn0x, mn1x, mn2x, mn3x, mn4x, mp1x and mp0x, from the outer loop bootstrapped drive circuit 102 comprised of mn0, mn1, mn2, mn3, mn4, mp1 and mp0 that drives output qbtstrp, and which typically has a large capacitive load. In an implementation of the embodiment of FIG. 1A the inner switching loop 101 devices, mn0x, mn1x, mn2x, mn3x, mn4x, mp1x and mp0x, sizes only need to be a small fraction of the size of the devices that drive the outer loop bootstrapped drive circuit 102 in bootstrapped switching circuitry 100. Proper sizing and size relationships depends on various design criteria for various parameters.

At least several aspects of the bootstrapped switching circuitry 100 make the faster turn-on possible. Because the input of mn1 is not driven from qbtstrp this allows mn1 (and mn1x) to turn-on faster since the qbtstrpx node, which drives mn1, does not have the typically large load capacitance which exists on the node qbtstrp. When mn1 turns on fast this results in the output qbtstrp also turning on fast. Also, because qbtstrpx of the inner loop 101 does not have to turn-off as fast as qbtstrp, this allows its pull down devices mn3x and mn4x to be smaller and thereby add less capacitance to qbtstrpx which allows qbtstrpx to rapidly go high and turn on mn1 even faster.

In an alternative implementation of the embodiment of FIG. 1A, mn1x may be replaced with a low-threshold device enabling even faster turn-on of mn1. Even though this may degrade the distortion at node qbtstrpx, since low-threshold devices in some process technologies tend to be more non-linear, this has very little impact on the overall distortion of the bootstrapped switching circuitry 100 at node qbtstrp since mn1 can still be implemented with a regular NMOS device. While the example embodiment of FIG. 1A shows one inner loop switching circuit 101 to drive qbtstrpx and one outer loop bootstrapped drive circuit 102, comprised of mn0, mn1, mn2, mn3, mn4, mp1 and mp0 to drive qbtstrp, the embodiment may be extended to a larger number of such loops to incrementally improve the turn-on time. For example, a third switching loop may be used to drive the gate of mn1x, while limiting the use of qbtstrpx to only drive the gate on mn1, thereby enabling potentially faster rise time for qbtstrpx.

Figure 1B:
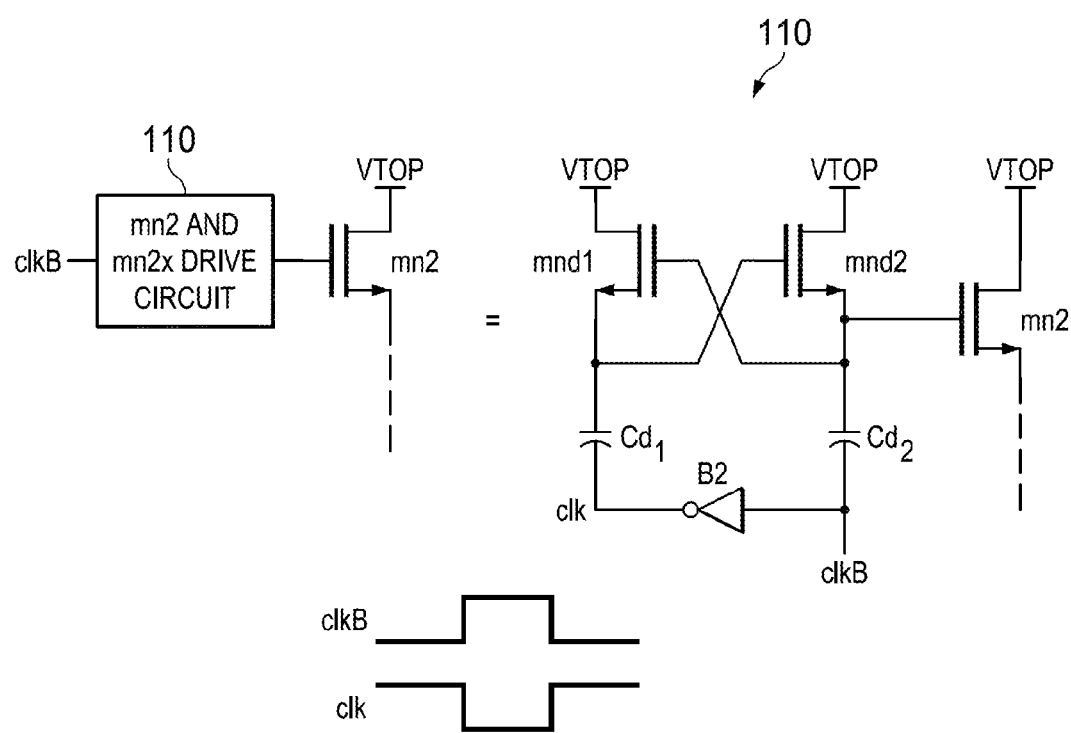
FIG. 1B illustrates example boosting drive circuitry that may be incorporated into the example embodiments of the disclosure.

Referring now to FIG. 1B, therein is illustrated an example of drive circuitry 110 that may be incorporated into an embodiment of the disclosure. The device circuitry 110 may comprise transistors mnd1 and mnd2, inverter B2, and capacitors Cd1 and Cd2. The drive circuitry 110 provides the drive signal for mn2 and mn2x from clkB. In FIG. 1B, while clk and clkB are shown as implemented as signals made with an inverter, they could instead be implemented as non-overlapping clocks (i.e. clkB goes low before clk goes high and vice versa).

Figure 3:
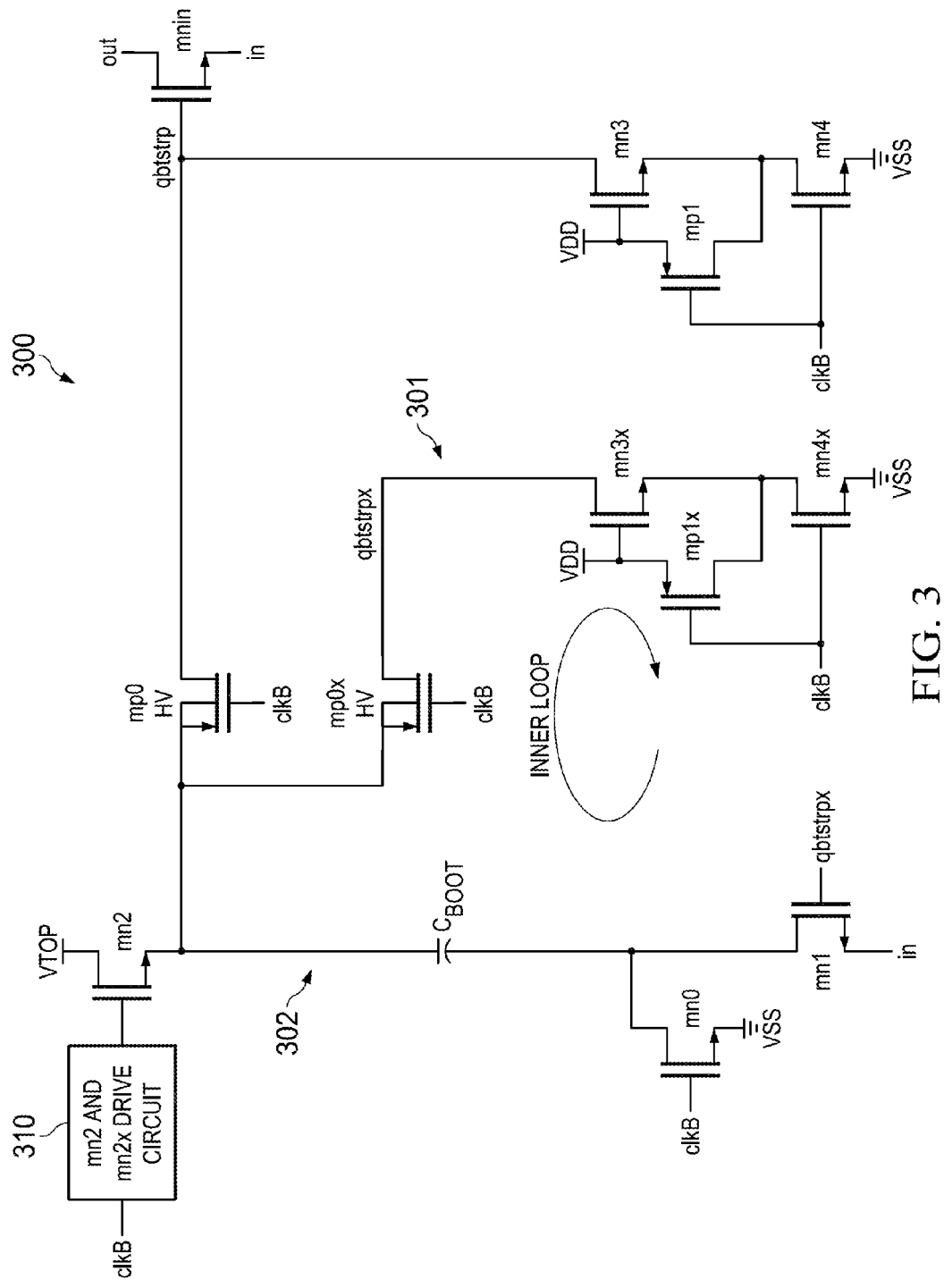
FIG. 3 illustrates an example bootstrapped switching circuit according to another embodiment of the disclosure.

Referring now to FIG. 3, therein is illustrated an example bootstrapped switching circuitry 300 in accordance with another embodiment of the disclosure. Bootstrapped switching circuitry 300 is implemented similarly to bootstrapped switching circuitry 100 of FIG. 1A, with the exception that in FIG. 3, the inner switching loop circuit 301 is configured to drive mn1 with qbtstrpx generated from the main $C_{BOOT}$ capacitor in conjunction with output switch mp0x. The example embodiment of FIG. 3 utilizes one boot capacitor, $C_{BOOT}$, instead of using a separate inner loop $C_{BOOTX}$ capacitor as does inner switching loop 101 in the embodiment of FIG. 1A. The operation of the embodiment of FIG. 3 is similar to the operation of the embodiment of FIG. 1A with the exception that the functions provided by mn1x, mn0x, and $C_{BOOTX}$ in the embodiment of FIG. 1A may be provided by mn1, mn0, and $C_{BOOT}$ in the embodiment of FIG. 3. While the embodiment of FIG. 3 may not turn on as fast as bootstrapped switching circuitry 100 of FIG. 1A, bootstrapped switching circuitry 300 still has faster turn-on than prior art bootstrapped switching circuits that do not have an inner switching loop according to the embodiments of the disclosure.

Figure 4:
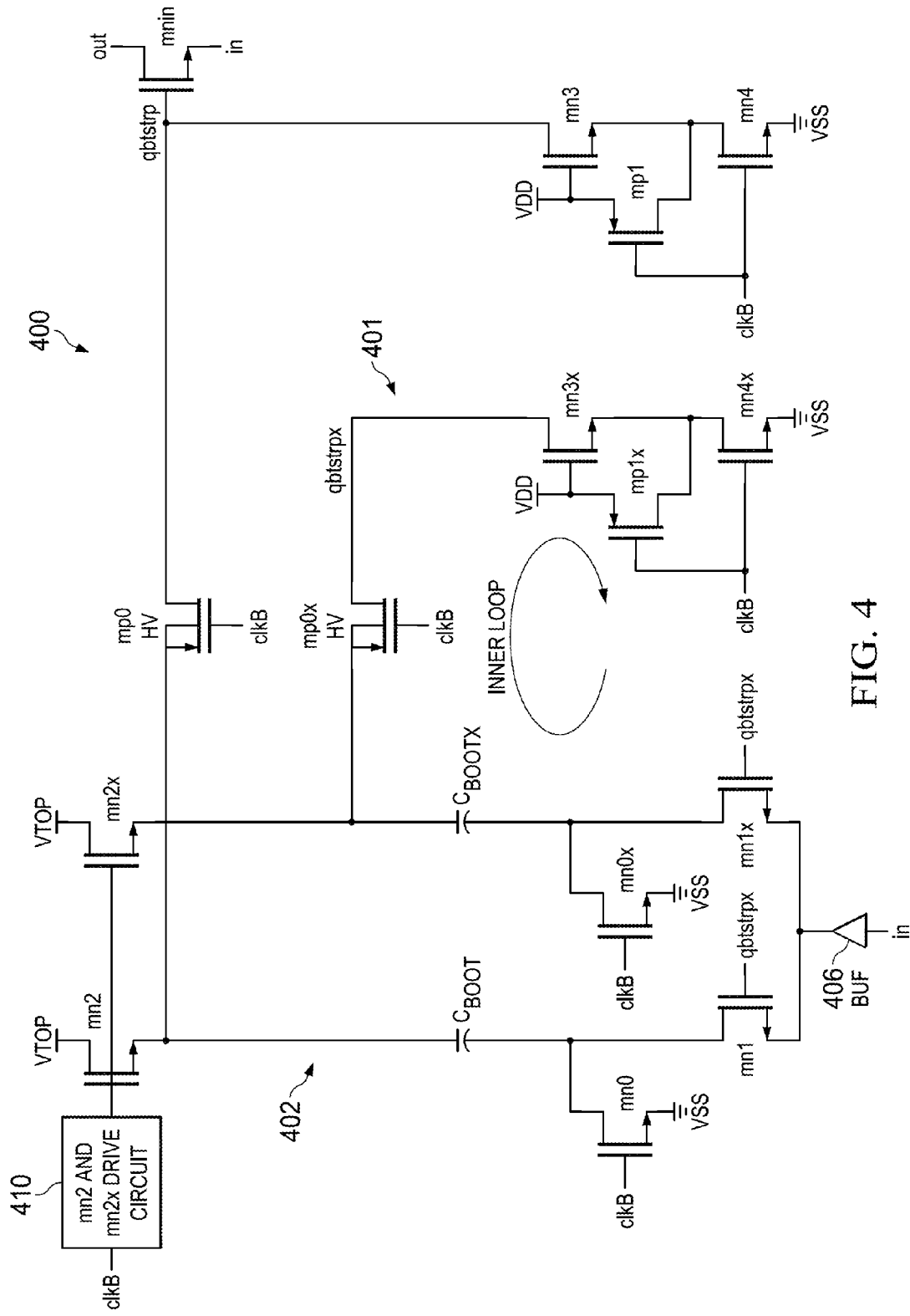
FIG. 4 illustrates an example bootstrapped switching circuit according to a further embodiment of the disclosure.

The turn-on time of the bootstrapped switching circuitry 100 of FIG. 1A is also affected by the impedance of the circuitry driving the input signal on "in". Typical circuitry that would drive "in" has finite impedance of approximately 50 or 75 ohms. To turn-on the bootstrapped switching circuitry 100 faster, bootstrapped switching circuitry 100 could be implemented using a low-impedance buffer (BUF) 406 as shown in example bootstrapped switching circuitry 400 in the embodiment of FIG. 4. Bootstrapped switching circuitry 400 is implemented similarly to bootstrapped switching circuitry 100 of FIG. 1A with the addition of buffer 406. Inserting a buffer as such at the input in the main loop's path affects the linearity of the qbtstrp signal if the buffer is non-linear, as is typically the case. There is no way to avoid this effect in a bootstrapped switching circuit without an inner switching loop according to the embodiments of the disclosure. However, in an implementation such as bootstrapped switching circuit 100 there is an advantage in that a buffer could be inserted just for the inner loop 101 to speed up turn-on without degrading the linearity of qbtstrp.

Figure 5:
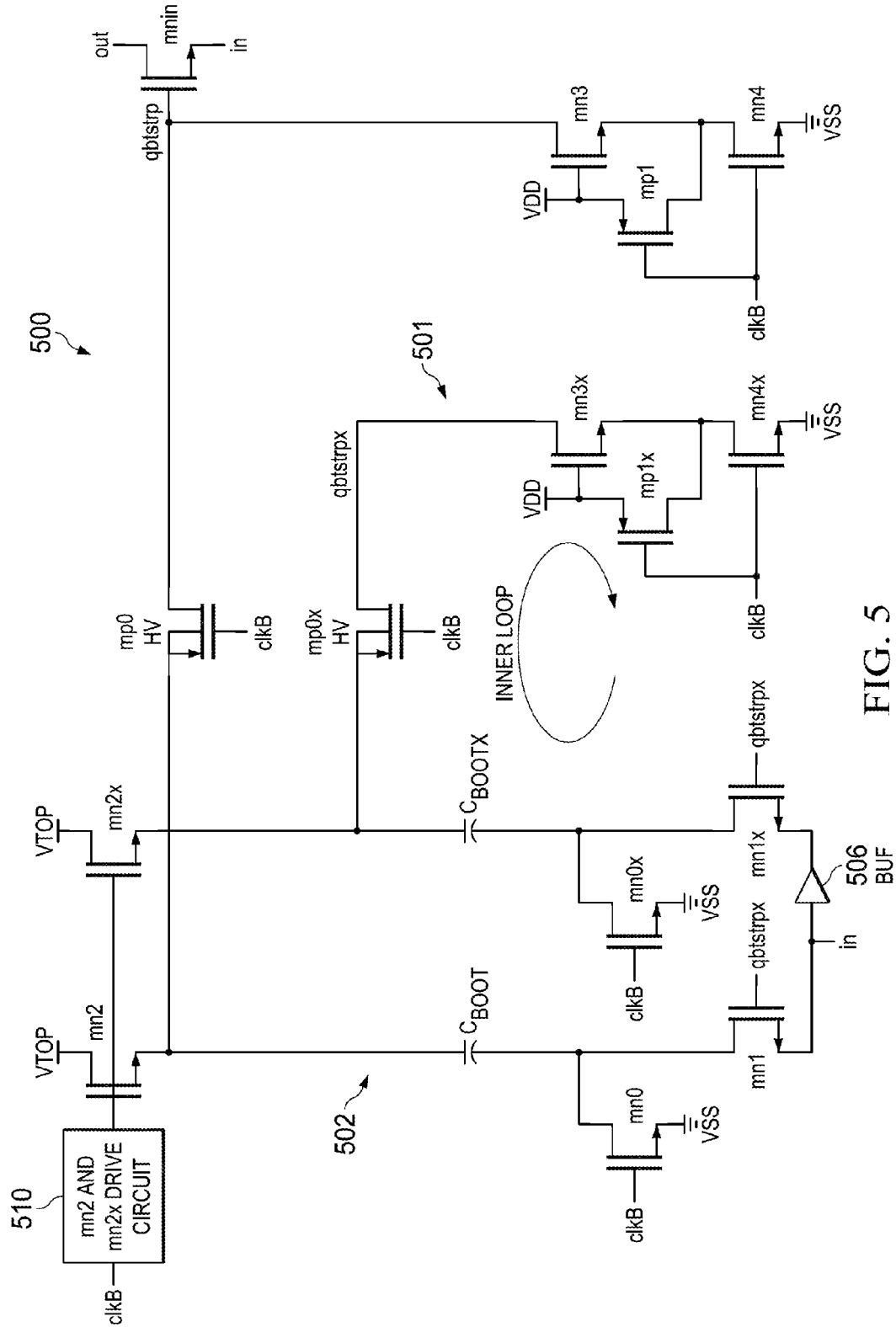
FIG. 5 illustrates an example bootstrapped switching circuit in accordance to a still further embodiment of the disclosure.

Referring now to FIG. 5, therein is illustrated an example bootstrapped switching circuitry 500 implemented in accordance with a further embodiment of the disclosure. Bootstrapped switching circuitry 500 is implemented similarly to bootstrapped switching circuitry 100 of FIG. 1A, with the modification that bootstrapped switching circuitry 500 includes a buffer 506 implemented between the "in" input and the source of mn1x to enable faster turn on of qbtstrpx (and hence faster turn on of qbtstrp). While the bootstrapped switching circuitry 400 of FIG. 4 may turn-on faster than the bootstrapped switching circuitry 500 shown in FIG. 5, the example embodiment shown in FIG. 5 has significantly better linearity for signal qbtstrp. This may be desirable in certain applications.

Figure 6:
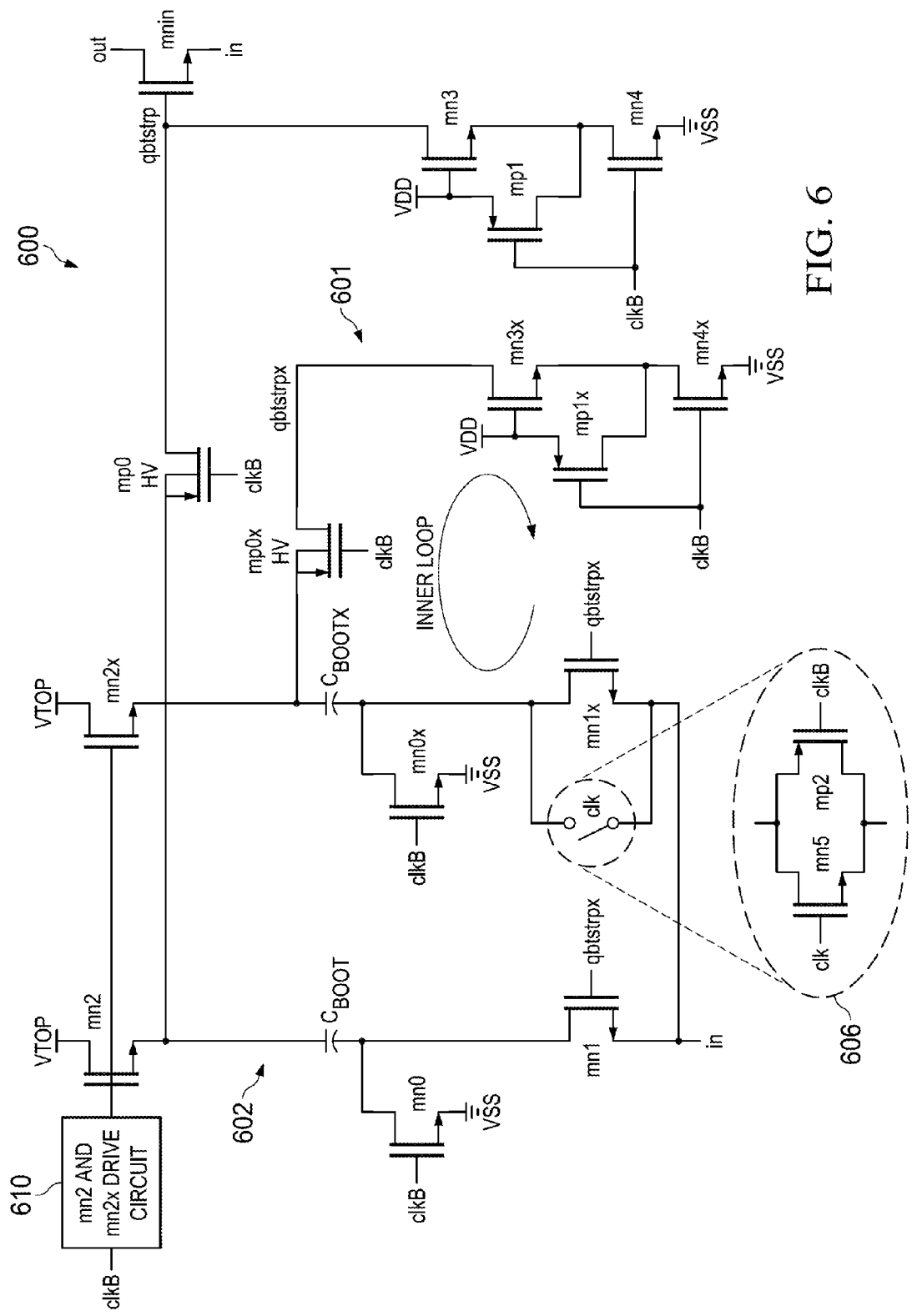
FIG. 6 illustrates an example bootstrapped switching circuit in accordance to another further embodiment of the disclosure.

Referring to FIG. 6, therein is illustrated an example bootstrapped switching circuitry 600 in accordance with another embodiment of the disclosure. Bootstrapped switching circuitry 600 is implemented similarly to bootstrapped switching circuitry 100 of FIG. 1A, with the modification of the addition of pass gate 606. To enable faster turn on, complementary pass gate 606 consisting of a NMOS transistor mn5 and PMOS transistor mpg driven by clk and clkB respectively (where clk is the complement of the clkB clocking signal) may either replace mn1x in the embodiment of FIG. 1A or it may be placed in parallel with mn1x from the embodiment of FIG. 1A to implement the bootstrapped switching circuitry 600 of FIG. 6. The example embodiment of FIG. 6 has a pass gate 606 implemented in parallel with mn1x. This provides the advantage of speeding up the turn-on of qbtstrpx and hence the turn-on of qbtstrp. This is possible because the embodiments of the disclosure have decoupled the linearity of the inner loop 601 from the outer loop bootstrapped drive circuit 602 to a large extent, allowing the addition of non-linear pass-gate 606 in series with the qbtstrpx signal. In FIG. 6 clk is the inverted version of clkB as shown in FIG. 1B.

Referring now to FIG. 7, therein is illustrated an example buffer that may be incorporated into the example embodiments of the disclosure. FIG. 7 shows buffer 700, comprising NMOS transistors mn8 and current source 701, which is a possible implementation, for example, of the buffers (BUF) 406 and 506 that were introduced in the embodiments of FIGS. 4 and 5, respectively.

Referring again to FIG. 1B, the example mn2 and mn2x drive circuitry 110 shown in FIG. 1B may also be used to implement drive circuitry 310,410,510,610, and 810 in the various embodiments of this disclosure.

Referring now to FIG. 8, therein is illustrated an example bootstrapped switching circuitry 800 in accordance with another embodiment of the disclosure. FIG. 8 shows an example embodiment which improves upon the turn-on time of a configuration of a bootstrapped switching circuit through use of potentially faster regular oxide regular threshold (Vth) PMOS transistors instead of the thick oxide high voltage (HV) PMOS transistors mp0 and mp0x implemented in the embodiment of FIG. 1A. Bootstrapped switching circuitry 800 is identical to bootstrapped switching circuitry 100 of FIG. 1A with the exception that example drive circuits 820 and 821 have been added to the circuitry of the embodiment. In embodiment of drive circuit 820, transistors mpg, mn5, and mn6 may be coupled to the gate of mp0, and, in the embodiment of drive circuit 821 transistors mp2x, mn5x and mn6x may be coupled to the gate of mp0x. In FIG. 8 the gate drive on mp0 and mp0x may be generated such that mp0 and mp0x does not see any voltage stress under nominal operating supply voltage, which allows use of potentially faster regular oxide threshold (Vth) PMOS transistors implemented as mp0 and mp0x instead of the high voltage (HV) PMOS transistors implemented as mp0 and mp0x of FIG. 1A. In FIG. 8, the gate drive transistors mn5 and mn5x may be controlled by the output of the inner loop qbtstrpx, decoupling the turn-on of the devices mp0 and mp0x from the heavily loaded output qbtstrp. Various embodiments based on the embodiment of FIG. 8 may be implemented that combine the various aspects of the other embodiments of this disclosure. FIG. 8 shows two clock signals to control the functioning of the bootstrapped switching circuit, clk and clkB. Clk is the inverted version of the clkB signal as shown in FIG. 1B. In an alternative embodiment, clk and clkB may be replaced with non-overlapping clocks. Non-overlapping clocks refer to two clocks, for example, clk and clkB, such that clkB goes low before clk goes high and vice versa. In other words the clocks are never high at the same time.

In the discussions of the embodiments above, the example switches and transistors are shown as NMOS or PMOS devices and deemed to be ON when the control signal or gate input signal is high for an NMOS transistor or low for a PMOS transistor, and deemed to be OFF when the control signal or gate input signal is low for an NMOS transistor or high for a PMOS transistor. However, it should be noted that the use of complementary switches and complementary drive levels is an equally viable option for implementing the switches. That is, PMOS transistors could replace NMOS transistors, and vice versa, with a complementary gate drive circuit, and both NMOS and PMOS transistors can be used in parallel using both polarities of a control signal. Also while the embodiments were each shown with a particular number of components and with specific components, one skilled in the art will realize that the embodiments have application to any number of components and that various components could be added or removed from the embodiments as shown, or replaced with other types of components, and still be within the scope of this disclosure.

In the disclosure of the embodiments above, switches and transistors are driven by logic signals such as clk and clkB that are complimentary signals. However, non-overlapping clocks on clk and clkB, or any other appropriate clocking method for the clocks, could be implemented as an alternative in any of the disclosed embodiments. Further, all switches that are shown to be driven by the same signal may be driven by buffered or delayed versions of a common input clock signal.

In other example embodiments, the electrical circuits of the FIGUREs may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGUREs may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGUREs and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In certain contexts, the features and embodiments discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used in image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smart phones, tablets, security systems, PCs, gaming technologies, virtual reality, simulation training, etc.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A switching circuit comprising:
   an input that receives an input signal;
   a bootstrapped drive circuit having a boot capacitor, an output switch, an input switch and a first output, wherein:
      when a clock signal driving the switching circuit is in a first state, the input switch couples the input to the boot capacitor and the output switch couples the boot capacitor to the first output, and
      the bootstrapped drive circuit configured to receive the input signal at the input switch and provide a first drive signal on the first output responsive to the input switch being switched on by a second drive signal; and,
   a switching loop coupled to the input and having a second output coupled to the input switch, the switching loop configured to provide the second drive signal to the input switch on the second output.

2. The switching circuit of claim 1 wherein the input switch of the bootstrapped drive circuit comprises a first input switch and the switching loop further comprises a second input switch coupled to the input, wherein the switching loop is configured to provide the second drive signal responsive to the second input switch being switched on by the second drive signal.

3. The switching circuit of claim 2, wherein the boot capacitor and the output switch of the bootstrapped drive circuit comprise a first boot capacitor and a first output switch, respectively, and the switching loop comprises a second boot capacitor coupled to the second input switch and a second output switch coupling the second boot capacitor to the second output and wherein the first and second output switches switch on in response to at least one clock signal being at a first logic level.

4. The switching circuit of claim 3, wherein the bootstrapped drive circuit further comprises at least one first charging switch coupled to the first boot capacitor and at least one first setting switch coupled to the first output, and, the switching loop comprises at least one second charging switch coupled to the second boot capacitor and at least one second setting switch coupled to the second output, wherein, when the at least one clock signal is at a second logic level, the first and second at least one charging switches turn on to charge the first and second boot capacitors to a first voltage and the first and second at least one setting switches turn on to set the first and second drive signals to a low logic level.

5. The switching circuit of claim 1 further comprising a bootstrapped switch with its gate coupled to the first output, the bootstrapped switch configured to turn on responsive to the first drive signal.

6. The switching circuit of claim 1 wherein the input switch comprises an shared input switch that further couples the input to the second output through the switching loop, and wherein the shared input switch functions as an input switch of the bootstrapped drive circuit and the switching loop.

7. The switching circuit of claim 6, wherein the shared input switch is coupled to the first output and second output through the boot capacitor of the bootstrapped drive circuit and wherein the boot capacitor functions as a boot capacitor of the bootstrapped drive circuit and the switching loop.

8. The switching circuit of claim 7, wherein the output switch of the bootstrapped drive circuit comprises a first output switch and the switching loop further comprises a second output switch, wherein the boot capacitor is coupled to the second output through the second output switch, and wherein the first and second output switches switch on in response to at least one clock signal.

9. The switching circuit of claim 1, wherein the input of the switching loop is coupled to the input through a buffer.

10. The switching circuit of claim 1, wherein the input of the switching loop and the input of the bootstrapped drive circuit are coupled to the input through a buffer.

11. The switching circuit of claim 1, wherein the input switch of the bootstrapped drive circuit comprises a first input switch, the switching loop comprises a first switching loop, the first switching loop further comprises a second input switch coupled to the input and the switching circuit comprises at least one second switching loop providing at least a third drive signal, wherein the first switching loop is configured to provide the second drive signal responsive to the second input switch being switched on by the at least a third drive signal.

12. The switching circuit of claim 1, wherein the switching loop comprises a pass gate coupled between the input and the second output, and wherein the pass gate turns on in response to at least one clock signal and the switching loop provides the second drive signal to the input switch when the pass gate is on.

13. The switching circuit of claim 1, wherein the output switch comprises a first output switch and the bootstrapped drive circuit further comprises a first output switch drive circuit coupled to the first output switch, and the switching loop comprises a second output switch coupled between the input and the second output and a second output switch drive circuit coupled to the second output switch, wherein the first and second output switch drive circuits are configured to receive the second drive signal and switch on the first and second output switches, respectively, in response to the second drive signal.

14. A method for switching by a switching circuit comprising:
receiving, when a clock signal driving the switching circuit is in a first state, an input signal on the input of a bootstrapped drive circuit;
receiving the input signal on the input of a switching loop;
providing a first drive signal on the output of the switching loop;
receiving the first drive signal at an input switch of the bootstrapped drive circuit and turning on the input switch; and,
providing, when the clock signal is in the first state, a second drive signal on the output of the bootstrapped drive circuit in response to receiving the first drive signal, wherein the second drive signal tracks the input signal on the input of the bootstrapped drive circuit.

15. The method of claim 14, wherein the input switch of the bootstrapped drive circuit is shared with the switching loop, the shared input switch is coupled to a boot capacitor, and the method further comprises:
receiving a first clock input at a first output switch coupling the boot capacitor to the output of the bootstrapped drive circuit and turning on the first output switch;
receiving a second clock input at a second output switch coupling the boot capacitor to the output of the switching loop circuit and turning on the shared input switch.

16. The method of claim 14 wherein the input switch comprises a first input switch coupled to a first boot capacitor, the switching loop comprises a second input switch coupled to the output of the switching loop through a second boot capacitor, and the method further comprises:
receiving the first drive signal at the second input switch in the switching loop and connecting the input of the switching loop to the second boost capacitor.

17. The method of claim 14, wherein the providing a first drive signal comprises:
receiving the input signal at a passgate coupling the input of the switching loop to a boost capacitor;
receiving a clock signal switching on the pass gate; and,
providing the first drive signal on the output of the switching loop circuit.

18. A switching circuit comprising:
switching loop means for receiving an input signal at an input of the switching circuit and generating a first drive signal;
bootstrapped circuit means for, when a clock signal driving the switching circuit is in a first state, receiving the input signal and the first drive signal from the switching loop means and outputting a second drive signal to bootstrapped switch means; and,
the bootstrapped switch means for receiving the second drive signal and switching on in response to the second drive signal.

19. The switching circuit of claim 18, wherein the bootstrapped circuit means comprises an input switch for receiving the input signal and for turning on in response to receiving the first drive signal and, wherein the bootstrapped circuit means generates and outputs the second drive signal in response to receiving the first drive signal and the input signal at the input switch.

20. The switching circuit of claim 19, wherein the switching loop means comprises an input switch for receiving the input signal and for turning on in response to receiving the first drive signal, and wherein the switching loop means generates the first drive signal to turn on the input switch of the bootstrapped circuit means in response to receiving the input signal and the first drive signal at the input switch.

* * * * *